(12) United States Patent
Jeon et al.

(10) Patent No.: US 12,387,950 B2
(45) Date of Patent: Aug. 12, 2025

(54) TRANSFER ASSEMBLY AND APPARATUS FOR TREATING A SUBSTRATE WITH THE TRANSFER ASSEMBLY

(71) Applicant: SEMES CO., LTD., Cheonan-si (KR)

(72) Inventors: Su Bin Jeon, Cheonan-si (KR); Duk Hyun Son, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 295 days.

(21) Appl. No.: 17/849,786

(22) Filed: Jun. 27, 2022

(65) Prior Publication Data

US 2022/0415679 A1    Dec. 29, 2022

(30) Foreign Application Priority Data

Jun. 28, 2021 (KR) .......................... 10-2021-0083589

(51) Int. Cl.
*H01L 21/677* (2006.01)
*B25J 11/00* (2006.01)
(Continued)

(52) U.S. Cl.
CPC ..... *H01L 21/67201* (2013.01); *B25J 11/0095* (2013.01); *B25J 15/0014* (2013.01);
(Continued)

(58) Field of Classification Search
None
See application file for complete search history.

(56) References Cited

U.S. PATENT DOCUMENTS 7,811,153 B1 * 10/2010 Blank ............... H01L 21/67742
451/9
11,276,575 B2 * 3/2022 Nozaki ............ H01L 21/67109
(Continued)

FOREIGN PATENT DOCUMENTS

JP    2017-098540 A    6/2017
JP    2019-057709 A    4/2019
(Continued)

OTHER PUBLICATIONS

Korean Patent Office, Office action issued on Nov. 28, 2022.
Japan Patent Office, Office action issued on Aug. 1, 2023.

*Primary Examiner* — Jonathan Snelting
(74) *Attorney, Agent, or Firm* — Li & Cai Intellectual Property (USA) Office

(57) ABSTRACT

A substrate treating apparatus is provided. The substrate treating apparatus includes an atmospheric pressure transfer module provided with a first transfer robot having a first hand with a substrate placed thereon; a vacuum transfer module provided with a second transfer robot having a second hand with a substrate placed thereon; a load-lock chamber positioned between the atmospheric pressure transfer module and the vacuum transfer module, and having an inner space convertible between an atmospheric pressure and a vacuum atmosphere; a process chamber coupled to the vacuum transfer module and treating the substrate; and a ring carrier supported by the first transfer robot or the second transfer robot for a transfer of a ring member. The ring carrier comprises a plate having the ring member placed thereon and at least one leg protruding from a bottom surface of the plate and placed at the first hand or the second hand.

15 Claims, 12 Drawing Sheets

(51) Int. Cl.
    *B25J 15/00*      (2006.01)
    *H01L 21/67*      (2006.01)
    *H01L 21/687*     (2006.01)

(52) U.S. Cl.
    CPC .... *H01L 21/67167* (2013.01); *H01L 21/6719* (2013.01); *H01L 21/67196* (2013.01); *H01L 21/67742* (2013.01); *H01L 21/68707* (2013.01)

(56) References Cited

U.S. PATENT DOCUMENTS

| | | | |
|---|---|---|---|
| 2020/0373194 A1 | 11/2020 | Volfovski et al. | |
| 2020/0411347 A1 | 12/2020 | Kopec et al. | |
| 2021/0159111 A1* | 5/2021 | Prengle | H01L 21/6875 |

FOREIGN PATENT DOCUMENTS

| | | |
|---|---|---|
| KR | 101163237 B1 | 6/2012 |
| KR | 1020170054248 A | 5/2017 |
| KR | 102090278 B1 | 3/2020 |

* cited by examiner

1

TRANSFER ASSEMBLY AND APPARATUS FOR TREATING A SUBSTRATE WITH THE TRANSFER ASSEMBLY

CROSS-REFERENCE TO RELATED APPLICATIONS

A claim for priority under 35 U.S.C. § 119 is made to Korean Patent Application No. 10-2021-0083589 filed on Jun. 28, 2021, in the Korean Intellectual Property Office, the entire contents of which are hereby incorporated by reference.

BACKGROUND

Embodiments of the inventive concept described herein relate to a transfer assembly and a substrate treating apparatus, more specifically, a transfer assembly for transferring a substrate and a ring member, and a substrate treating apparatus having the same.

A plasma refers to an ionized gas state composed of ions, radicals, and electrons. The plasma is produced by a very high temperatures, a strong electric field, or a high frequency electromagnetic field (RF electromagnetic field). A semiconductor device manufacturing process may include an etching process of removing a thin film formed on a substrate such as a wafer using the plasma. The etching process is performed by colliding ions and/or radicals of the plasma with the thin film on the substrate or reacting with the thin film.

A substate treating apparatus using the plasma includes a process chamber, a support assembly for supporting the substrate in the process chamber, and a plasma source for generating the plasma from a gas for treating the substrate. The support assembly includes an electrostatic chuck fixing the substrate by an electrostatic force and a focus ring surrounding an outer circumference of the substrate seated on the electrostatic chuck. The focus ring distributes the plasma with a high uniformly on a surface of the substrate. When an etching is repeatedly performed on the substrate, the focus ring is also etched, thereby gradually changing a form of the focus ring. According to a change in the form of the focus ring, a direction in which ions and/or radicals are incident on the substrate is changed, and thus etching characteristics for the substrate are changed. Therefore, when an etching treatment on the substrate is repeatedly performed, or when a form shape of the focus ring is changed and is outside an allowable range, a replacement of the focus ring is required.

Generally, the replacement of the focus ring is accomplished by an operator opening the process chamber, taking out a used focus ring from an open process chamber, and mounting an unused focus ring to the process chamber. However, such a replacement method not only requires a lot of work time, but also has a high possibility that particles are introduced into the process chamber. Accordingly, recently, a replacement method is used whereby the used focus ring is taken out from the process chamber and introduced to a ring pod by a transfer robot of the substrate treating apparatus, and then a new focus ring is taken out from the ring pod and introduced into the process chamber by the transfer robot.

A transfer of the focus ring may be performed by a transfer robot that transfers the substrate. In addition, the focus ring may be transferred by the transfer robot using a ring carrier. When the focus ring is transferred using the ring carrier, a pad for supporting the substrate may be contaminated by the ring carrier. For this reason, a problem of transferring a contamination to the substrate while transferring the substrate occurs. This results in an increase in a defect rate of a substrate treatment process. In addition, when a ring carrier seated on the substrate is shaken, the focus ring seated on the ring carrier slides or is distorted. This may result in a change in a mounting position of the focus ring within the process chamber so that the focus ring may not be properly mounted to the process chamber.

SUMMARY

Embodiments of the inventive concept provide a transfer assembly for stably transferring a ring member, and a substrate treating apparatus having the same.

Embodiments of the inventive concept provide a transfer assembly for stably transferring a ring carrier used for a transfer of a ring member without changing a structure of a transfer hand, and a substrate treating apparatus having the same.

Embodiments of the inventive concept provide a transfer assembly for minimizing a contamination of a pad supporting a substrate by a ring carrier while a transfer hand identical to the ring carrier and the substrate is used for a transfer, and a substrate treating apparatus having the same.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes an atmospheric pressure transfer module provided with a first transfer robot having a first hand with a substrate placed thereon; a vacuum transfer module provided with a second transfer robot having a second hand with a substrate placed thereon; a load-lock chamber positioned between the atmospheric pressure transfer module and the vacuum transfer module, and having an inner space convertible between an atmospheric pressure atmosphere and a vacuum atmosphere; a process chamber coupled to the vacuum transfer module and treating the substrate; and a ring carrier which can be supported by the first transfer robot or the second transfer robot for a transfer of a ring member provided at the process chamber and supporting the ring member, and wherein the ring carrier comprises: a plate having the ring member placed thereon; and at least one leg protruding from a bottom surface of the plate and placed at the first hand or the second hand.

In an embodiment, a leg is provided as a pad.

In an embodiment, at least one substrate support pad for supporting a substrate is provided at a top surface of the first hand or the second hand, and wherein the pad is provided at a height at which the plate is upwardly spaced apart from the substrate support pad, when the ring carrier is placed on the first hand or the second hand.

In an embodiment, the pad and the substrate support pad are positioned to not interfere with each other seen from above when the first transfer robot or the second transfer robot transfers the ring member.

In an embodiment, the pad is a cylindrical shape.

In an embodiment, a leg is provided as a pin, and at least one substrate support pad for supporting a substrate is provided at a top surface of the first hand or the second hand, and a hole for inserting an end of the pin is further included.

In an embodiment, the pin is positioned at a height at which the plate is upwardly spaced apart from the substrate support pad, when the ring carrier is placed on the first hand or the second hand.

In an embodiment, the pin and the substrate support pad is positioned to not interfere with each other when seen from above when the first transfer robot or the second transfer robot transfers the ring member.

In an embodiment, the pin is provided in a cylindrical shape with a downwardly convex bottom surface.

In an embodiment, the plate is a circular plate form.

In an embodiment, the load-lock chamber comprises a plurality of support shelves supporting the substrate or the ring member, and wherein a plurality of notches are formed through the plate at an edge region of the plate, and the ring member supported by the ring carrier is seated on a support shelf when the first transfer robot or the second transfer robot is moved from a top side to a bottom side of the plurality of support shelves, and the plurality of notches are positioned to be aligned with the plurality of support shelves so the ring carrier moves together with the first transfer robot and the second transfer robot.

The inventive concept provides a transfer assembly. The transfer assembly includes a ring carrier supporting a ring member; and a transfer robot having a transfer hand for selectively transferring a substrate and the ring carrier, and wherein the ring carrier comprises: a plate on which the ring member is placed; and at least one leg protruding from a bottom surface of the plate, and provided placed on the transfer hand.

In an embodiment, the leg is provided as a pad.

In an embodiment, at least one substrate support pad for supporting the substrate is placed at a top surface of the transfer hand, and wherein the pad is provided at a height at which the plate is upwardly spaced apart from the substrate support pad, when the ring carrier is placed on the transfer hand.

In an embodiment, the pad and the substrate support pad are positioned to not overlap with each other when seen from above when the transfer robot transfers the ring member.

In an embodiment, the leg is provided as a pin, and at least one substrate support pad for supporting the substrate is provided at a top surface of the transfer hand, and a hole for inserting an end of the pin is further included, and wherein the pin is provided at a height at which the plate is upwardly spaced apart from the substrate support pad, when the ring carrier is placed on the transfer hand, and the pin and the substrate support pad are positioned to not interfere with each other when seen from above when the transfer robot transfers the ring member.

In an embodiment, the plate is a circular plate form.

The inventive concept provides a substrate treating apparatus. The substrate treating apparatus includes a load port on which a container storing a substrate, a ring carrier, or a ring member is placed thereon; an index chamber having an inside maintained at an atmospheric pressure atmosphere, and providing a transfer robot; a load-lock chamber having an inside convertible between an atmospheric pressure and a vacuum pressure; and a ring carrier used during a transfer of a ring member between the load port, the load-lock chamber, and the index chamber, and wherein the transfer robot comprises: a transfer hand selectively transferring a substrate and the ring carrier; and at least one substrate support pad for supporting the substrate, and wherein the load-lock chamber comprises a plurality of support shelves supporting the substrate or the ring member, and wherein the ring carrier comprises: a plate on which the ring member is placed; and at least one leg protruding from a bottom surface of the plate, and provided placed on the transfer hand, and wherein a plurality of notches are formed through the plate at an edge region of the plate, and the plurality of notches are positioned to overlap each of the plurality of support shelves when seen from above, and wherein among the ring carrier and the ring member, the ring member is seated on a support shelf when the transfer robot transfers the ring member using the ring carrier, and wherein the leg is positioned at a height at which the plate is upwardly spaced apart from the substrate support pad, when the ring carrier is paced on the transfer hand, and wherein the leg and the substrate support pad are positioned to not interfere with each other when seen from above when the transfer robot transfers the ring member.

In an embodiment, the leg is provided as a pad.

In an embodiment, the leg is provided as a pin, and a hole for inserting an end of the pin is further included at a top surface of the transfer robot According to an embodiment of the inventive concept, a substrate and a ring member may be stably transferred.

According to an embodiment of the inventive concept, a slipping or a distortion of a position of a ring carrier used for transferring a ring member at a transfer hand when the ring member is transferred may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
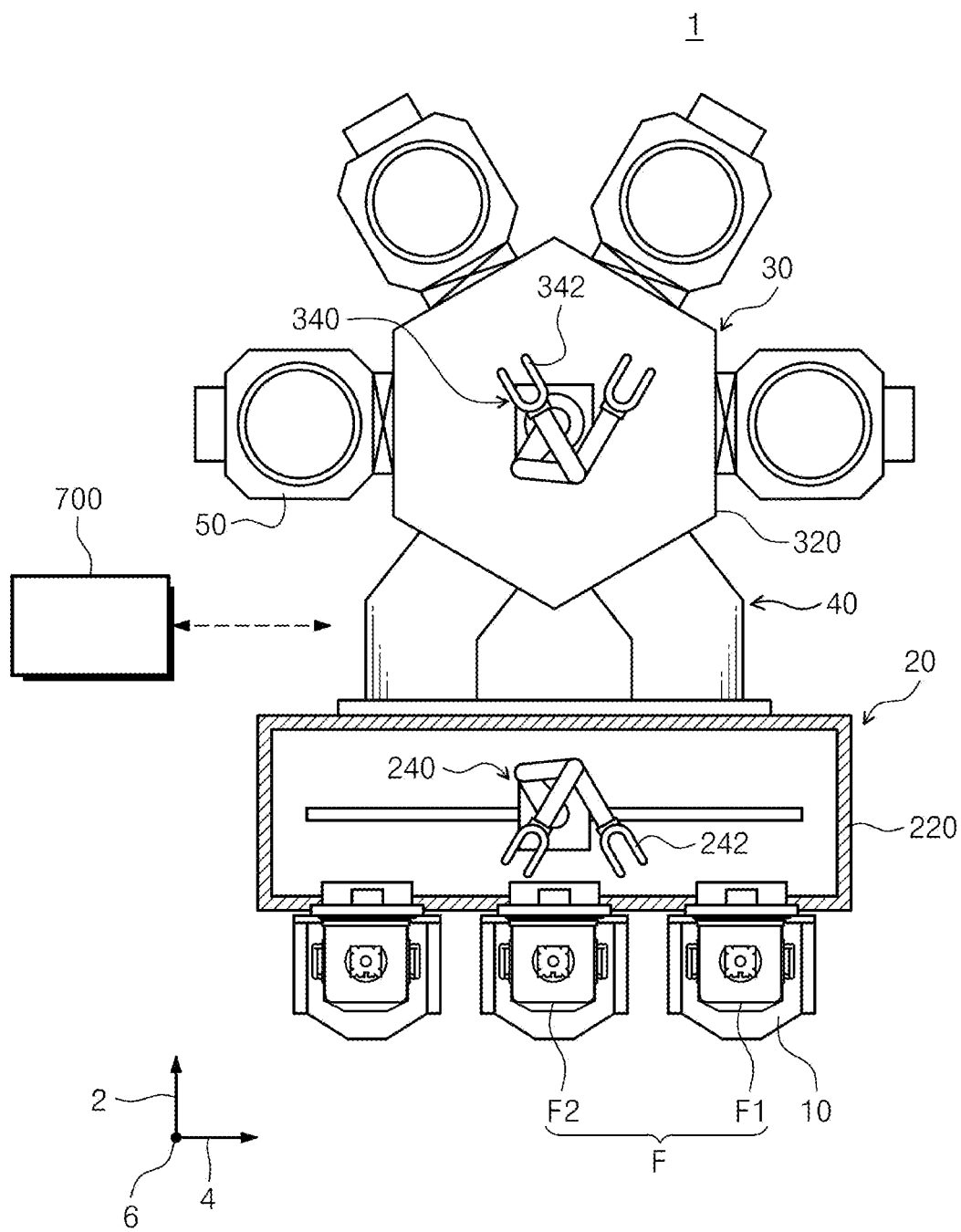
FIG. 1 schematically illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described in detail with reference to FIG. 1 to FIG. 17.

FIG. 1 schematically illustrates a substrate treating apparatus according to an embodiment of the inventive concept. Referring to FIG. 1, the substrate treating apparatus 1 according to an embodiment of the inventive concept may include a load port 10, an atmospheric pressure transfer module 20, a vacuum transfer module 30, a load lock chamber 40, a process chamber 50, and a ring carrier 60 (referring to FIG. 9).

The load port 10 may be disposed on a side of the atmospheric pressure transfer module 20 to be described later. One or more load ports 10 may be provided. The number of load ports 10 may increase or decrease according to a process efficiency, foot print conditions, and the like. A container F according to an embodiment of the inventive concept may be placed in the load port 10. The container F may be loaded onto or unloaded from the load port 10 by a transfer means (not shown) such as an overhead transfer apparatus (OHT), an overhead conveyor, or an automatic guided vehicle, or by an operator. The container F may include various types of containers according to a type of an article to be stored. As the container F, an airtight container such as a front opening integrated pod (FOUP) may be used.

Various articles may be stored within the container F. The container F may include various types of containers according to a type of an article to be stored. For example, an object to be treated by the substrate treating apparatus 1 may be stored within a first container F1, which is one of the containers F. The object to be treated may be a substrate W such as a wafer. A support slot F11 on which the substrate W is seated may be provided at the first container F1. In addition, within a second container F2, which is another one of the containers F, a ring member R mounted on the substrate treating apparatus 1 and requiring replacement may be stored. The ring member R may be a focus ring or a dielectric ring installed at the process chamber 50 to be described later. A support slot F21 on which the ring member R is seated may be provided at the second container F2. Selectively, the ring member R and the ring carrier 60 may be stored within the second container F2. A support slot F22 on which the ring carrier 60 is seated may be provided at the second container F2. An outer circumferential diameter of the ring member R may have a diameter larger than an outer circumferential diameter of the substrate W. Accordingly, the space in the second container F2 may have a slightly larger volume than the space in the first container F1.

The atmospheric pressure transfer module 20 and the vacuum transfer module 30 may be arranged in a first direction 2. Hereinafter, when viewed from above, a direction perpendicular to the first direction 2 is defined as a second direction 4. In addition, a direction perpendicular to a plane including both the first direction 2 and the second direction 4 is defined as a third direction 6. Here, the third direction 6 is a direction perpendicular to the ground.

The atmospheric pressure transfer module 20 may selectively transfer the substrate W or the ring member R between the container F and the load lock chamber 40 to be described later. For example, the atmospheric pressure transfer module 20 may take out the substrate W from the container F and transfer the substrate W to the load lock chamber 40, or may take out the substrate W from the load lock chamber 40 and transfer the substrate W to the container F. The atmospheric pressure transfer module 20 may include a transfer frame 220 and a first transfer robot 240. The transfer frame 220 may be provided between the load port 10 and the load lock chamber 40. That is, the load port 10 may be connected to the transfer frame 220. The transfer frame 220 may be provided with an atmospheric pressure therein. An inside of the transfer frame 220 may be maintained in an atmospheric pressure atmosphere.

The transfer frame 220 may be provided with a first transfer robot 240. The first transfer robot 240 may selectively transfer the substrate W or the ring member R between the container F seated on the load port 10 and the load lock chamber 40 to be described later.

The first transfer robot 240 may move in a up/down direction. The first transfer robot 240 may have a first transfer hand 242 that moves forwardly, backwardly, or rotates on a horizontal plane. One or a plurality of first transfer hands 242 of the first transfer robot 240 may be provided. The substrate W may be placed on the first transfer hand 242. Selectively, a ring carrier 60 to be described later supporting the ring member R may be placed on the first transfer hand 242. The first transfer robot 240 and the ring carrier 60 supporting the ring member R may be defined as a transfer assembly for transferring the ring member R between the container F, the atmospheric pressure transfer module 20, and the load lock chamber 40 to be described later.

Figure 2:
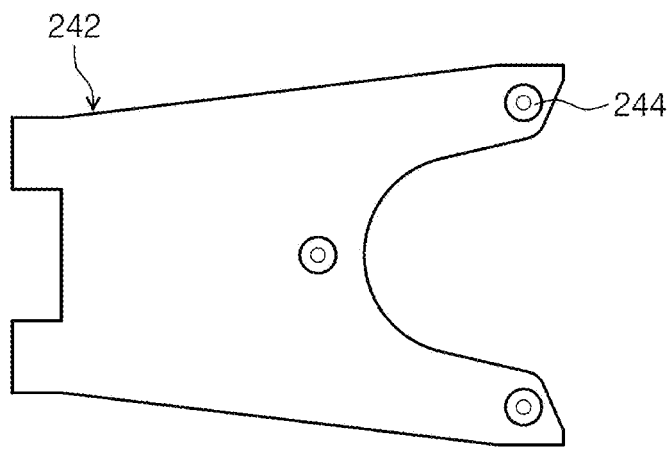
FIG. 2 schematically illustrates a first transfer hand of FIG. 1.

FIG. 2 schematically illustrates a state of the first transfer hand of FIG. 1. Referring to FIG. 2, at least one substrate support pad 244 may be provided on a top surface of the first transfer hand 242. For example, three substrate support pads 244 may be provided to support the substrate placed on the first transfer hand 242 at three points. The substrate support pad 244 may prevent the substrate W placed on the first transfer hand 242 from slipping. The substrate support pads 244 may be arranged along a circumferential direction of a virtual circle having a radius when viewed from above. The substrate support pad 244 may be provided in a substantially disk shape. A vacuum adsorption hole (not shown) may be formed within the substrate support pad 244. The substrate support pad 244 may vacuum-adsorb the substrate W to transfer the substrate W.

Referring back to FIG. 1, the vacuum transfer module 30 may be disposed between a load lock chamber 40 to be described later and a process chamber 50 to be described later. The vacuum transfer module 30 may include a transfer chamber 320 and a second transfer robot 340.

The transfer chamber 320 may maintain an inner atmosphere as a vacuum pressure atmosphere. The transfer chamber 320 may be provided with a second transfer robot 340. In an embodiment, the second transfer robot 340 may be located in a central area of the transfer chamber 320. The second transfer robot 340 may selectively transfer the substrate W or the ring member R between the load lock chamber 40 and the process chamber 50. Selectively, the vacuum transfer module 30 may transfer the substrate W between the process chambers 50. The second transfer robot 340 may move in a horizontal and vertical direction. The second transfer robot 340 may have a second transfer hand 342 that moves forwardly, backwardly, or rotates on a horizontal plane. At least one second transfer hand 342 of the second transfer robot 340 may be provided.

Figure 3:
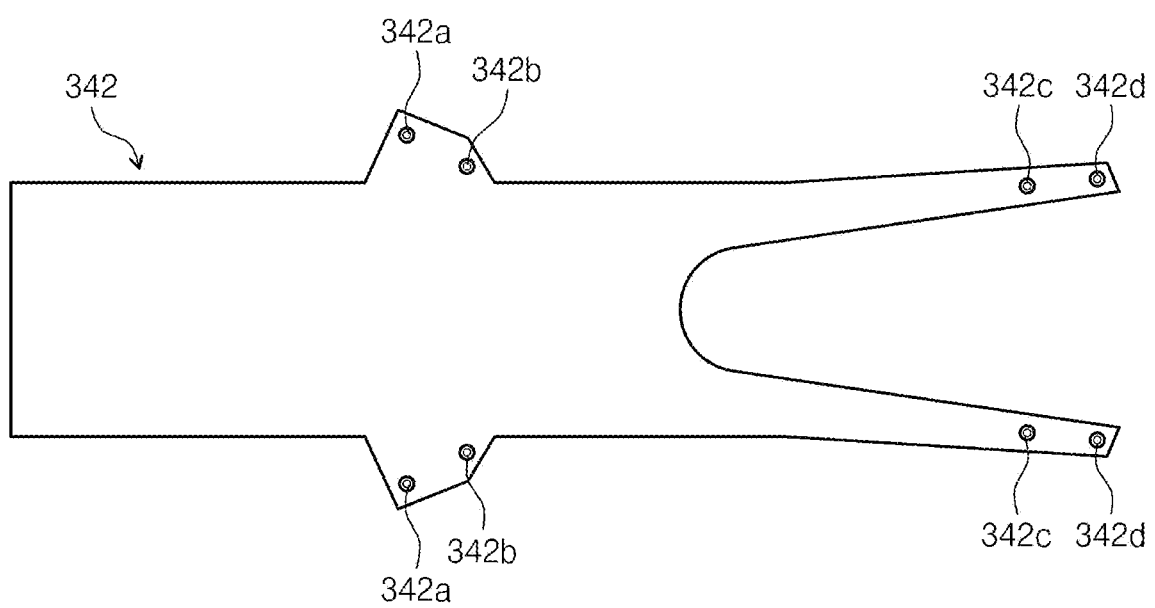
FIG. 3 schematically illustrates a second transfer hand of FIG. 1.

FIG. 3 illustrates a state of the second transfer hand of FIG. 1. Referring to FIG. 3, the second transfer hand 342 may have a size relatively larger than that of the first transfer hand 242. A pair of first transfer pads 342a, a pair of second transfer pads 342b, a pair of third transfer pads 342c, and a pair of fourth transfer pads 342d may be provided on a top surface of the second transfer hand 342. The second transfer pad 342b and the third transfer pad 342c may be disposed between the first transfer pad 342a and the fourth transfer pad 342d. When viewed from above, the second transfer pad 342b and the third transfer pad 342c may be disposed inside an outer circumference of the substrate W. Accordingly, the second transfer pad 342b and the third transfer pad 342c may support the substrate W. When viewed from above, the first transfer pad 342a and the fourth transfer pad 342d may be disposed outside an outer circumference of the substrate W and an inner circumference of the ring member R, but may be disposed inside a circumference of the ring member R. Accordingly, the first transfer pad 342a and the fourth transfer pad 342d may support the ring member R.

Referring back to FIG. 1, at least one process chamber 50 to be described later may be connected to the transfer chamber 320. The transfer chamber 320 may be provided in a polygonal shape. A load lock chamber 40 and a process chamber 50 may be disposed around the transfer chamber 320. For example, as shown in FIG. 1, a hexagonal shaped transfer chamber 320 may be disposed at a central area of the vacuum transfer module 30, and a load lock chamber 40 and a process chamber 50 may be disposed around the transfer chamber 320. However, a shape of the transfer chamber 320 and the number of process chambers may be variously modified and provided according to the needs of a user.

The load lock chamber 40 may be disposed between the transfer frame 220 and the transfer chamber 320. The load lock chamber 40 provides a buffer space B in which the substrate W or the ring member R is exchanged between the transfer frame 220 and the transfer chamber 320. In an embodiment, to replace the ring member R disposed at the process chamber 50, the ring member R used at the process chamber 50 may temporarily remain at the load lock chamber 40. In an embodiment, in order to transfer a new ring member R scheduled to replace an old ring member R to the process chamber 50, the new ring member R may temporarily remain at the load lock chamber 40.

As mentioned above, an inner atmosphere of the transfer frame 220 may be maintained in an atmospheric pressure atmosphere, and the inner atmosphere of the transfer chamber 320 may be maintained in a vacuum pressure atmosphere. The load lock chamber 40 is disposed between the transfer frame 220 and the transfer chamber 320, so that an inner atmosphere thereof may be converted between the atmospheric pressure atmosphere and a vacuum pressure atmosphere.

Figure 4:
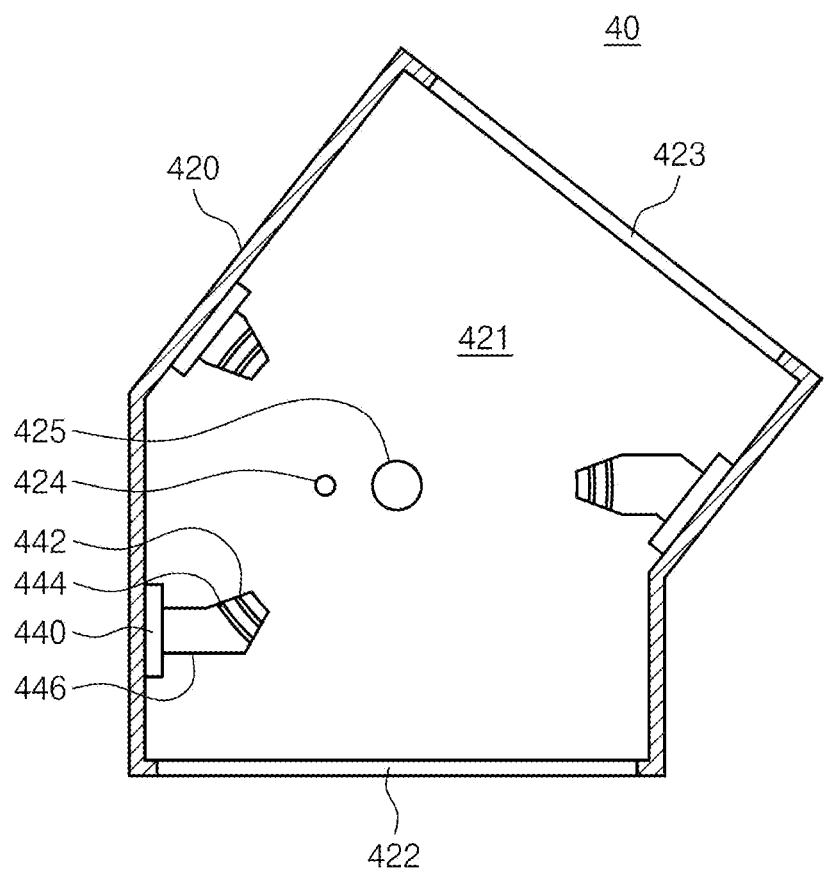
FIG. 4 is a plan cross-sectional view illustrating a load lock chamber of FIG. 1.
Figure 5:
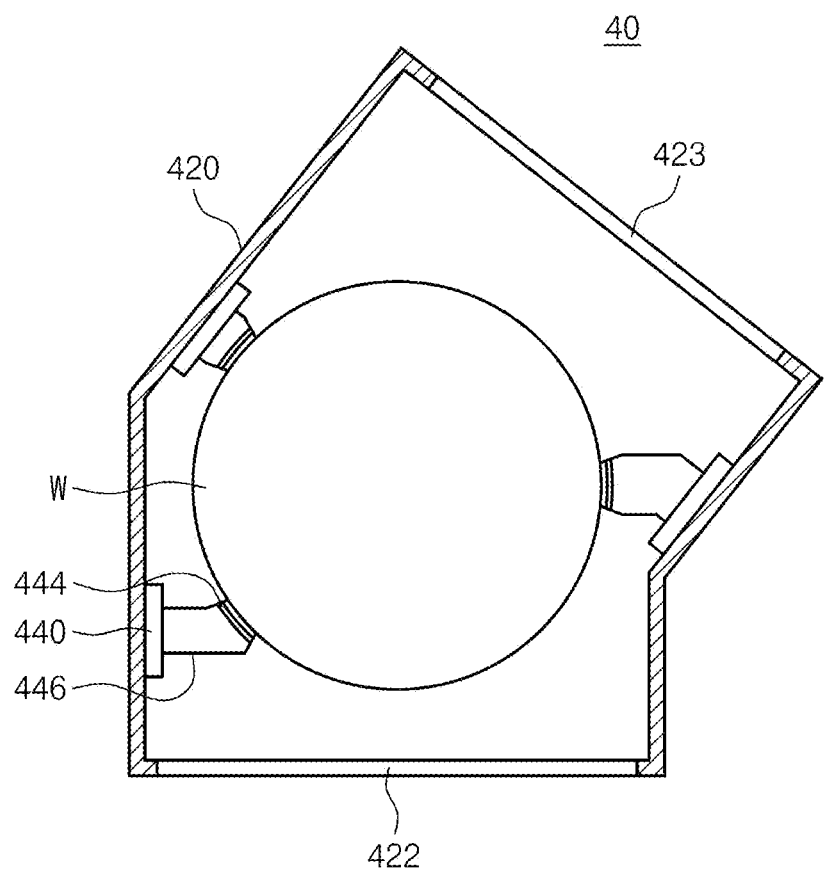
FIG. 5 illustrates a state in which a substrate is placed on a support shelf of FIG. 4.
Figure 6:
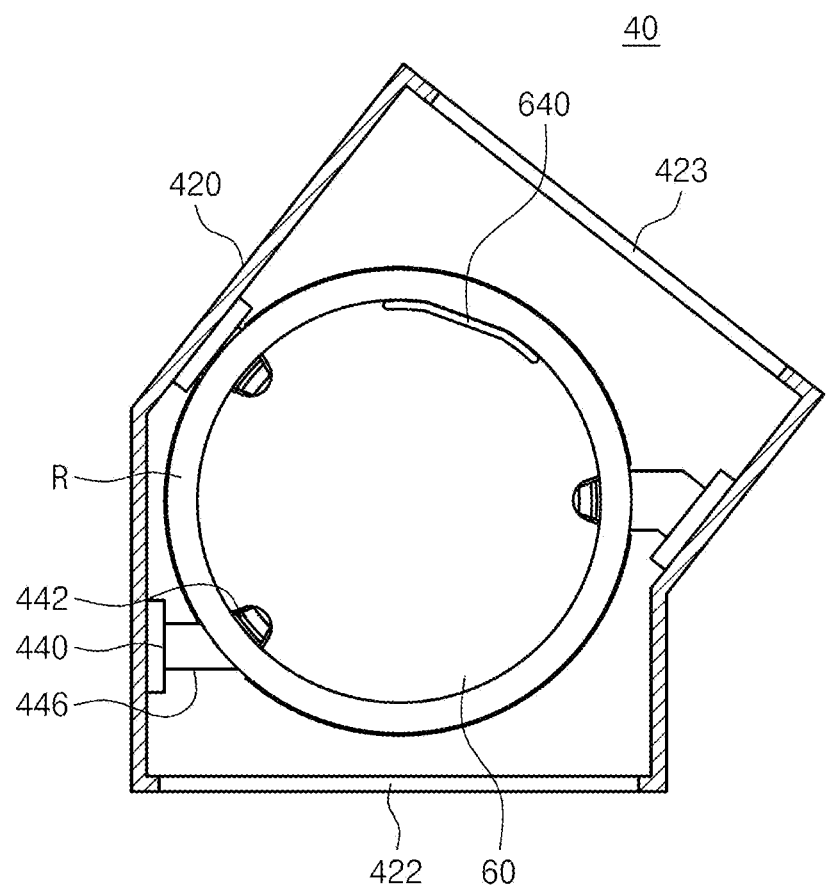
FIG. 6 illustrates a state in which a ring member is placed on the support shelf of FIG. 4.
Figure 7:
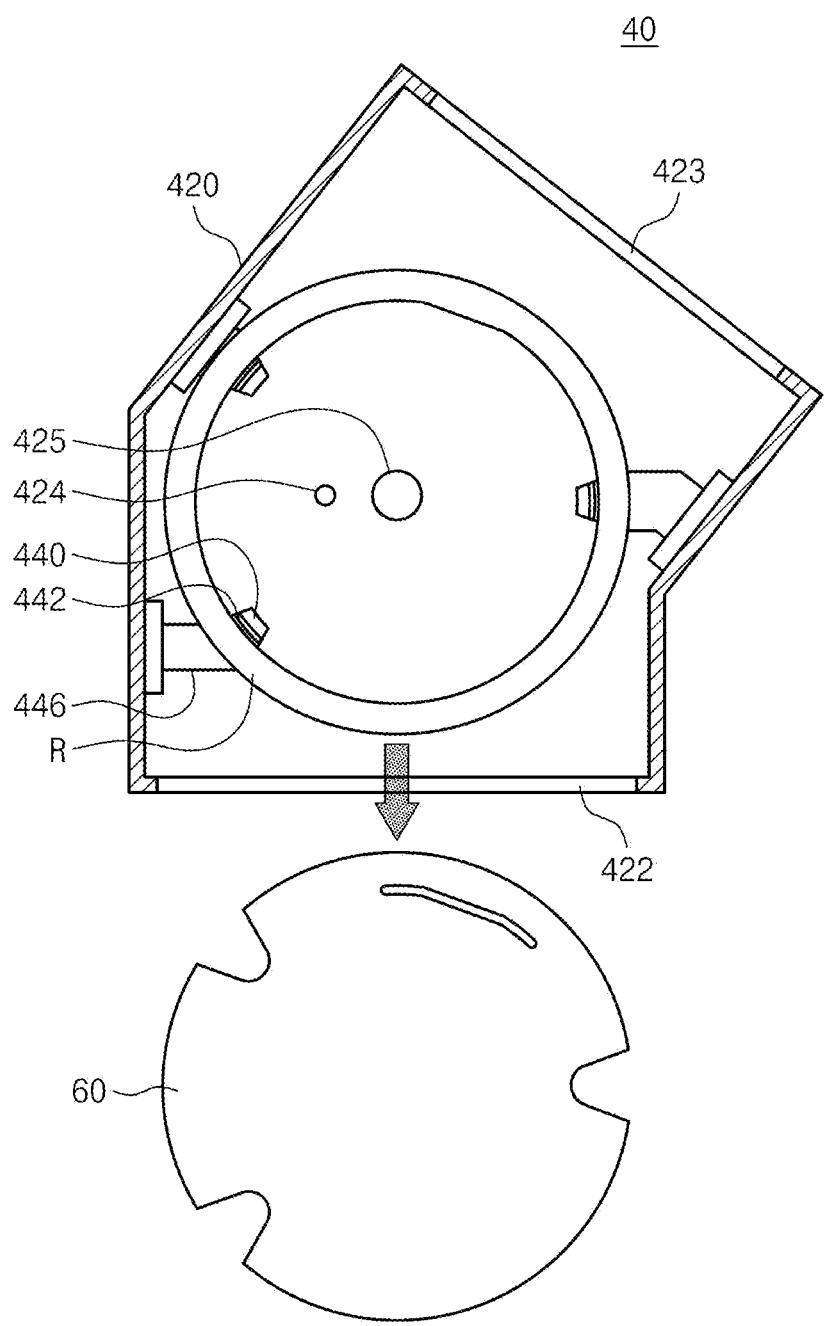
FIG. 7 illustrates a state in which a ring carrier on the support shelf of FIG. 6 is taken out of the load lock chamber.

FIG. 4 is a plan cross-sectional view illustrating a state of a load lock chamber of FIG. 1. FIG. 5 illustrates a state in which a substrate is placed on a support shelf of FIG. 4. FIG. 6 illustrates a state in which a ring member is placed on the support shelf of FIG. 4. FIG. 7 illustrates a state in which a ring carrier on the support shelf of FIG. 6 is taken out of the load lock chamber.

Referring to FIG. 4 to FIG. 7, the load lock chamber 40 may include a housing 420 and a support shelf 440. The housing 420 may have an inner space in which the substrate W or the ring member R is placed. The housing 420 may be disposed between the transfer frame 220 and the transfer chamber 320. In addition, a first opening 422 and a second opening 423 may be formed at the housing 420. The first opening 422 may be provided on a surface facing the transfer frame 220 and may be opened and closed by a gate valve (not shown). The second opening 423 may be provided on a surface facing the transfer chamber 320 and may be opened and closed by a gate valve (not shown).

A gas supply hole 424 for supplying a gas to the inner space 421 of the housing 420 may be formed at the housing 420. The gas may be an inert gas. For example, the gas may be a gas including a nitrogen, an argon, or the like. However, the inventive concept is not limited thereto, and the gas may be variously modified and provided as a known inert gas.

A depressurizing hole 425 for depressurizing the inner space 421 of the housing 420 may be formed at the housing 420. The depressurizing hole 425 may be connected to a depressurizing member (not shown). The depressurizing member may be a pump. However, the inventive concept is not limited thereto, and the depressurizing member may be variously modified to a known device for depressurizing the inner space 421.

As the gas supply hole 424 and the depressurizing hole 425 are formed at the housing 420, a pressure of the inner space of the housing 420 may be switched between an atmospheric pressure and a vacuum pressure.

A support shelf 440 may be provided at the inner space 421. The support shelf 440 may support the substrate W or the ring member R at the inner space 421. At least one support shelf 440 may be provided. Selectively, a plurality of support shelves 440 may be provided. For example, three support shelves 440 may be provided. A plurality of support shelves 440 may be provided to be spaced apart from each other when viewed from above. The plurality of support shelves 440 may be vertically spaced apart from each other. For this reason, the substrate W or the ring member R may be supported in multiple layers at the inner space 421.

Each of the support shelves 440 may include a support protrusion 442. When viewed from above, the support protrusion 442 may be disposed at a position aligned with a notch 621 formed at the ring carrier 60 to be described later. When viewed from its cross section, the support protrusion 442 may have an upside down "L" shape. The support protrusion 442 may include a first shelf pad 444 and a second shelf pad 446.

The first shelf pad 444 and the second shelf pad 446 may be made of a material having a friction with respect to the substrate W or the ring member R. For example, the first shelf pad 444 and the second shelf pad 446 may be made of a material such as a carbon-filled poly-ether-ether-ketone (PEEK). However, a use of the PEEK as a material of the first shelf pad 444 and the second shelf pad 446 is only one embodiment, and may be variously modified to other known materials having similar properties.

When viewed from above, the first shelf pad 444 may have an arc shape in its lengthwise direction. The first shelf pad 444 may be disposed closer to the depressurizing hole 425 than the second shelf pad 446. When viewed from above, the first shelf pad 444 may be disposed inside an outer circumference of the substrate W. Accordingly, as shown in FIG. 5, the first shelf pad 444 may support the substrate W among the substrate W and the ring member R.

When viewed from above, the second shelf pad 446 may generally have an arc shape in its lengthwise direction. The second shelf pad 446 may be disposed away from the depressurizing hole 425 than the first shelf pad 444. When viewed from above, the second shelf pad 446 may be disposed outside the outer circumference of the substrate W and an inner circumference of the ring member R, but may be disposed inside an outer circumference of the ring member R. Accordingly, the second shelf pad 446 may support the ring member R among the substrate W and the ring member R.

When viewed from above, a plurality of support protrusions 442 are disposed at positions aligned with a plurality of notches 621 formed at the ring carrier 60. Accordingly, as illustrated in FIG. 6, the ring carrier 60 with the ring member R placed thereon may be introduced into a higher position than the support protrusion 442 within the load lock chamber 40 by the first transfer hand 242, and when the first transfer hand 242 downwardly moves, the ring member R may be placed on the support protrusion 442, and the ring carrier 60 may be downwardly moved with the first transfer hand 242 placed thereon. Thereafter, as shown in FIG. 7, the first transfer hand 242 retreats.

Referring back to FIG. 1, at least one process chamber 50 may be connected to the transfer chamber 320. A plurality of process chambers 50 may be provided. The process chamber 50 may be a chamber that performs a process on the substrate W. The process chamber 50 may be a plasma chamber that treats the substrate W using a plasma. For example, the process chamber 50 may be a chamber performing an etching process of removing a thin film on the substrate W using the plasma, an ashing process of removing a photoresist film, a deposition process of forming a thin film on the substrate W, or a dry cleaning process. However, the inventive concept is not limited thereto, and a plasma treatment process performed at the process chamber 50 may be variously modified to a known plasma treatment process.

Figure 8:
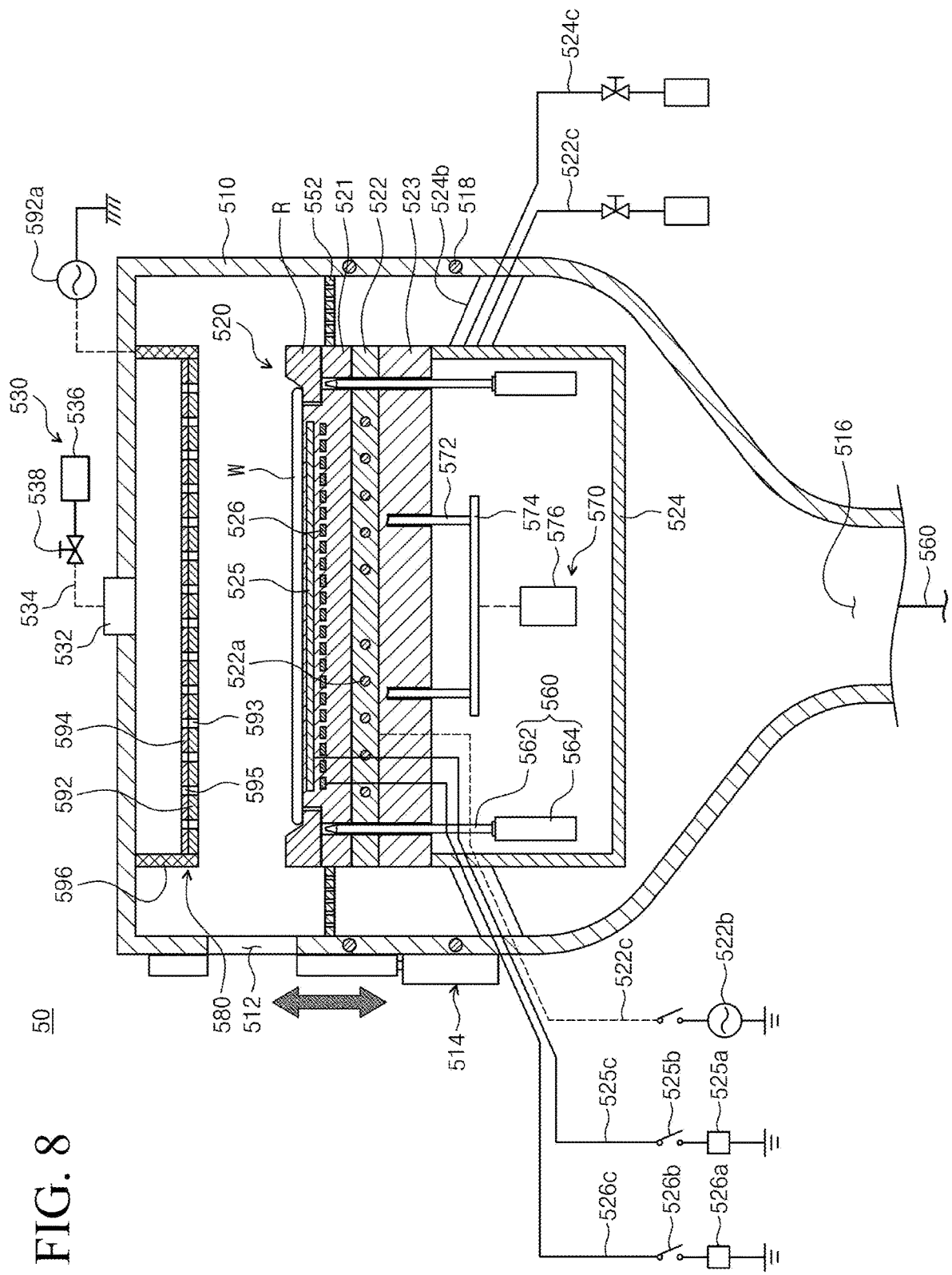
FIG. 8 schematically illustrates an embodiment of a process chamber of FIG. 1.

FIG. 8 schematically illustrates an embodiment of a process chamber of FIG. 1. Referring to FIG. 8, the process chamber 50 may treat a substrate W by transferring a plasma to the substrate W. The process chamber 50 may include a housing 510, a support unit 520, a gas supply unit 530, and a plasma source 540.

The housing 510 provides a treating space in which a substrate treating space is performed. The housing 510 may be provided in a sealed shape. When treating the substrate W, the treating space of the housing 510 may be generally maintained in a vacuum atmosphere. The housing 510 may be formed of a metal material. In an embodiment, the housing 510 may be made of an aluminum material. The housing 510 may be grounded. The substrate W and an inlet 512 through which a ring member R is carried in or out may be formed on a side of the housing 510. The inlet 512 may be selectively opened and closed by a gate valve 514.

An exhaust hole 516 may be formed at the bottom surface of the housing 510. An exhaust line 560 may be connected to the exhaust hole 516. The exhaust line 560 may exhaust a process gas, process by-products, and the like supplied to the treating space of the housing 510 through the exhaust hole 516. An exhaust baffle 552 may be provided above the exhaust hole 516 to allow a more uniform exhaust of the treating space. When viewed from above, the exhaust baffle 552 may have a generally ring shape. In addition, at least one hole may be formed at the exhaust baffle 552.

A heater 518 is provided on a wall of the housing 510. The heater 518 heats a wall of the housing 510. The heater 518 is electrically connected to a heating power source (not shown). The heater 518 generates a heat by resisting a current applied from a heating power source (not shown). The heat generated from the heater 518 is transferred to the treating space to maintain the treating space at a predetermined temperature. The heater 518 may be provided as a coil-shaped heating wire. A plurality of heaters 518 may be provided on the wall of the housing 510.

The support unit 520 is located within the housing 510. The support unit 520 may be provided to be upwardly spaced apart from a bottom surface of the housing 510. The support unit 520 supports the substrate W. The support unit 520 includes an electrostatic chuck that adsorbs the substrate W using an electrostatic force. In contrast, the support unit 520 may support the substrate W in various ways such as a vacuum adsorption or a mechanical clamping. Hereinafter, the support unit 520 including the electrostatic chuck will be described.

The support unit 520 may include a dielectric plate 521, a cooling plate 522, an insulating plate 523, and a bottom body 524. The dielectric plate 521 is located at the top end of the support unit 520. The dielectric plate 521 receives an external power and applies the electrostatic force to the substrate W. The dielectric plate 521 may be provided as a disk-shaped dielectric substance. The substrate W is placed on a top surface of the dielectric plate 521. The top surface of the dielectric plate 521 has a smaller radius than that of the substrate W. When the substrate W is placed on the top surface of the dielectric plate 521, an edge area of the substrate W is located outside the dielectric plate 521. An electrode 525 and a heater 526 are buried within the dielectric plate 521. The electrode 525 may be positioned above the heater 526.

The electrode 525 is electrically connected to a first power source 525a. The first power source 525a may include a DC power source. A switch 525b is installed between the electrode 525 and the first power source 525a. The electrode 525 may be electrically connected to the first power source 525a by on/off of the switch 525b. When the switch 525b is turned on, a DC current is applied to the electrode 525. The electrostatic force acts between the electrode 525 and the substrate W by a current applied to the electrode 525. Accordingly, the substrate W is adsorbed on the dielectric plate 521.

The heater 526 is electrically connected to a second power source 526a. The heater 526 generates a heat by resisting a current applied from the second power source 526a. A generated heat is transferred to the substrate W through the dielectric plate 521. The substrate W may be maintained at a predetermined temperature by the heat generated from the heater 526. The heater 526 may include a spiral coil. A plurality of heaters 526 are provided. The heater 526 may be provided in different regions of the dielectric plate 521. For example, a heater 526 for heating a central region of the dielectric plate 521 and a heater 526 for heating an edge region of the dielectric plate 521 may be provided, and the heaters 526 may be independently controlled from each other.

In the above-described example, the heater 526 is provided within the dielectric plate 521, but the inventive concept is not limited thereto, and the heater 526 may not be provided within the dielectric plate 521.

The cooling plate 522 is located under the dielectric plate 521. The cooling plate 522 may be provided in a disk shape. The cooling plate 522 may be made of a conductive material. In an embodiment, the cooling plate 522 may be made of an aluminum material. A top central region of the cooling plate 522 may have an area corresponding to a bottom surface of the dielectric plate 521.

A top flow path 522a may be provided within the cooling plate 522. The top flow path 522a may be formed in a spiral shape within the cooling plate 522. The top flow path 522a may cool the cooling plate 522. A cooling fluid may be supplied to the top flow path 522a. In an embodiment, the cooling fluid may be provided as a cooling water.

The cooling plate 522 may include a metal plate. According to an embodiment, an entire area of the cooling plate 522 may be provided as a metal plate. The cooling plate 522 may be electrically connected to a third power source 522b. The third power source 525b may be provided as a high frequency power source generating a high frequency power. The high frequency power source may be provided as an RF power source. The RF power source may be provided as a high bias power RF power source. The cooling plate 522 receives the high frequency power from the third power source 525b. For this reason, the cooling plate 522 may function as an electrode. The cooling plate 522 may be provided to be grounded.

An insulating plate 523 is provided under the cooling plate 522. The insulating plate 523 is made of an insulating material, and electrically insulates the cooling plate 522 from a bottom body 524 to be described later. The insulating plate 523 may be provided in a circular plate shape when viewed from above. The insulating plate 523 may be provided with an area corresponding to that of the cooling plate 522.

The bottom body 524 is provided under the cooling plate 522. The bottom body 524 may be provided under the insulating plate 523. The bottom body 524 may be provided in a ring shape when viewed from above. A first lift pin module 570 to be described later and a second lift pin module 580 to be described later may be positioned within an inner space of the bottom body 524.

The bottom body 524 has a connecting member 524b. The connecting member 524b connects an outer surface of the bottom body 524 with an inner sidewall of the housing 510. A plurality of connecting members 524b may be provided on the outer surface of the bottom body 524 at regular intervals. The connecting member 524b supports the support unit 520 within the housing 510. In addition, the connecting member 524b is connected to the inner sidewall of the housing 510, so that the bottom body 524 is electrically grounded. A first power line 525c connected to the first power source 525a, a second power line 526c connected to the second power source 526a, a third power line 522c connected to the third power source, a first fluid supply line 522d connected to the top flow path 524a, a second fluid supply line 524d connected to the bottom flow path 524a, and the like extends to an outside of the housing 510 through an inner space of the connecting member 524b.

The ring member R is disposed at an edge region of the support unit 520. The ring member R may have a ring shape when viewed from above. The ring member R may have a form in which a height of an inner top surface is lower than a height of an outer top surface. A bottom surface of an edge region of the substrate W may be placed on the inner top surface of the ring member R. In addition, the ring member R may have an upwardly inclined surface from a center of the substrate W toward an outside of the substrate W between the inner top surface and the outer top surface of the ring member R. Accordingly, when the substrate W is placed on the inner top surface of the ring member R, the substrate W may slide along an inclined surface of the ring member R to be appropriately placed on the inner top surface of the ring member R, even if the placement position may be slightly inaccurate.

The gas supply unit 530 supplies a process gas to the treating space of the housing 510. The gas supply unit 530 may include a gas supply nozzle 532, a gas supply line 534, and a gas storage unit 536. The gas supply nozzle 532 may be installed in a central area of a top surface of the housing 510. An injection hole is formed on a bottom surface of the gas supply nozzle 532. The injection hole supplies the process gas into the housing 510. The gas supply line 534 connects the gas supply nozzle 532 and the gas storage unit 536. The gas supply line 534 supplies a process gas stored at the gas storage unit 536 to the gas supply nozzle 532. A valve 538 is installed at the gas supply line 534. The valve 538 may adjust a flow rate of the process gas supplied through the gas supply line 534 by opening and closing the gas supply line 534.

The plasma source 540 excites the process gas in the housing 510 into a plasma state. In an embodiment of the inventive concept, a capacitively coupled plasma (CCP) is used as the plasma source. The capacitively coupled plasma source may include a top electrode and a bottom electrode within the housing 510. The top electrode and the bottom electrode may be vertically disposed parallel to each other within the housing 510. One of both electrodes may apply a high frequency power, and the other electrode may be grounded. An electromagnetic field is formed in a space between both electrodes, and the process gas supplied to the space may be excited in the plasma state. A substrate treatment process is performed using the plasma. According to an embodiment, the top electrode may be provided as a shower head unit 590 to be described later, and the bottom electrode may be provided as the aforementioned metal plate. A high frequency power may be applied to the bottom electrode, and the top electrode may be grounded. Alternatively, the high frequency power may be applied to the top electrode and the bottom electrode, respectively. For this reason, an electromagnetic field is generated between the top electrode and the bottom electrode. The generated electromagnetic field excites the process gas provided within the housing 510 into the plasma state.

A first lift pin module 570 may lift and lower the ring member R disposed on a top surface of the dielectric plate 521. The first lift pin module 570 may include a first lift pin 572 and a first pin driver 574. The first lift pin 572 may move in a top/down direction along a pin hole formed at the dielectric plate 521, the cooling plate 522, and/or the insulating plate 523. A plurality of first lift pins 572 may be provided. When viewed from above, the first lift pin 572 are provided at a position that does not overlap the heater 526 and the top flow path 522a. The first pin driver 574 may move the first lift pin 572 in the up/down direction. The first pin driver 574 may be provided in a plurality. The first pin driver 574 may be a cylinder or a motor using an air pressure or a hydraulic pressure. However, the inventive concept is not limited thereto, and the first pin driver 574 may be provided to various known devices capable of providing a driving force.

The second lift pin module 580 may lift and lower the substrate W. The second lift pin module 580 may include a second lift pin 582, a lifting/lowering plate 584, and a second pin driver 586. The second lift pin 582 may be coupled to the lifting/lowering plate 584. The lifting/lowering plate 584 may be moved in the up/down direction by the second pin driver 586.

A shower head unit 590 may include a shower head 592, a gas injection plate 594, and a support unit 596. The shower head 592 may be positioned to be downwardly spaced apart from the top surface of the housing 510 by a predetermined distance. A certain space may be formed between the gas injection plate 594 and the top surface of the housing 510. The shower head 592 may be provided in a plate shape having a constant thickness. A bottom surface of the shower head 592 may be anodized to prevent a generation of an arc due to the plasma. A cross section of the shower head 592 may be provided to have a same form and a cross-sectional area as the support unit 520. The shower head 592 includes a plurality of through holes 593. A through hole 593 penetrates a top surface and the bottom surface of the shower head 592 in the up/down direction. The shower head 592 may include a metal material. The shower head 592 may be electrically connected to a fourth power source 592a. The fourth power source 592a may be provided as a high frequency power source. Alternatively, the shower head 592 may be electrically grounded.

The gas injection plate 594 may be located on a top surface of the shower head 592. The gas injection plate 594 may be positioned to be upwardly spaced apart from the top surface of the housing 510 by a predetermined distance. The gas injection plate 594 may be provided in a plate shape having a constant thickness. The gas injection plate 594 is provided with an injection hole 595. The injection hole 595 penetrates the top surface and the bottom surface of the gas injection plate 594 in the up/down direction. The injection hole 595 is positioned opposite the through hole 593 of the shower head 592. The gas injection plate 594 may include a metal material.

A support portion 596 supports the side portions of the shower head 592 and the gas injection plate 594. A top end of the support portion 596 is connected to the top surface of the housing 510, and a bottom end is connected to a side of the shower head 592 and the gas injection plate 594. The support portion 596 may include a non-metallic material.

The ring carrier 60 may be used to carry the ring member R. The ring carrier 60 may be used to carry the ring member R by the first transfer robot 240 or the second transfer robot 340. For example, the ring carrier 60 may be used to transfer the ring member R between the atmospheric pressure transfer module 20 and the load lock chamber 40 by the first transfer robot 240. Hereinafter, a case in which the ring member R is transferred by the first transfer robot 240 will be described as an example.

The ring carrier 60 may be stored within the container F. For example, the ring carrier 60 may be stored within the second container F2. In this case, the ring carrier 60 may be stored below the ring member R stored in the second container F2.

Figure 9:
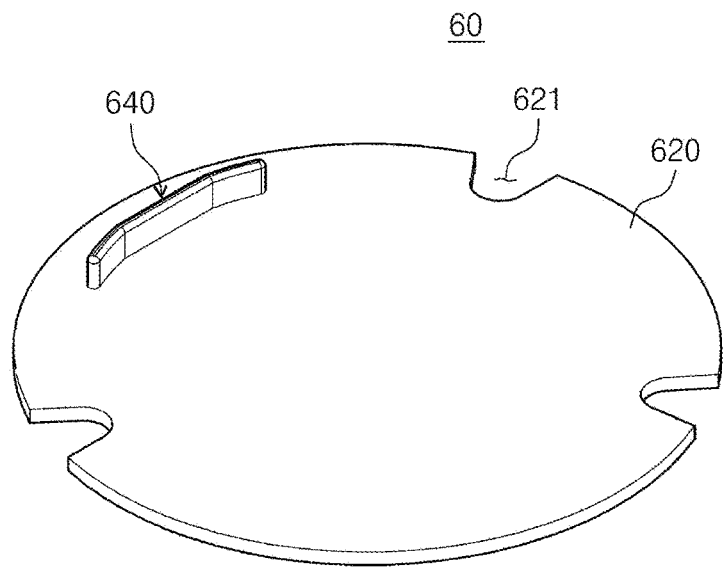
FIG. 9 is a perspective view schematically illustrating an embodiment of the ring carrier used to transfer the ring member.
Figure 10:
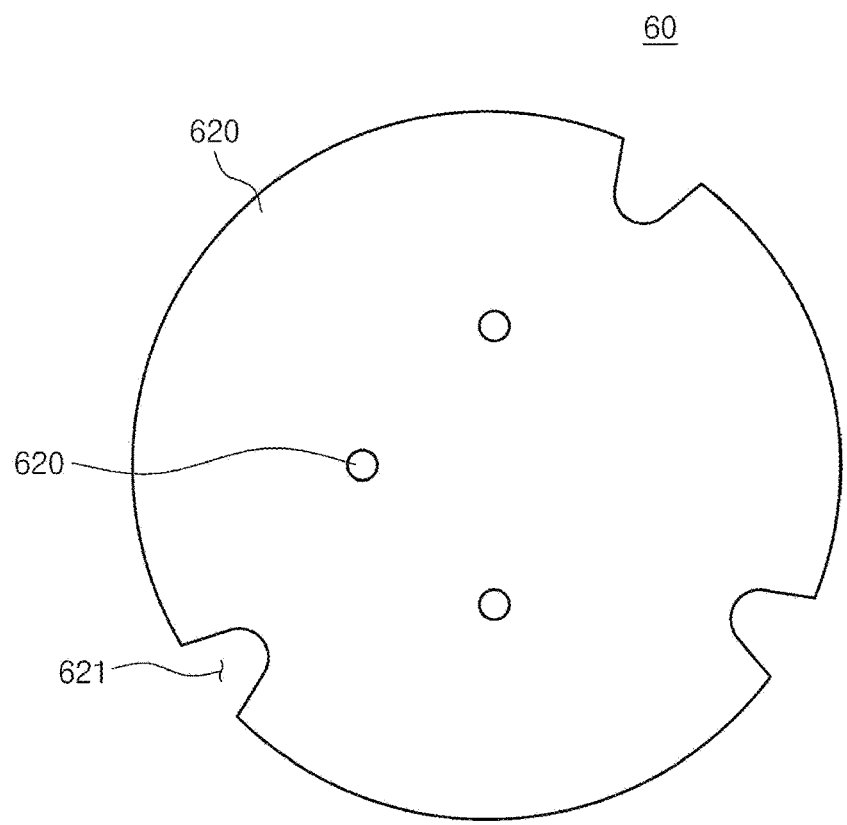
FIG. 10 is a plan view of a bottom surface of the ring carrier of FIG. 9.
Figure 11:
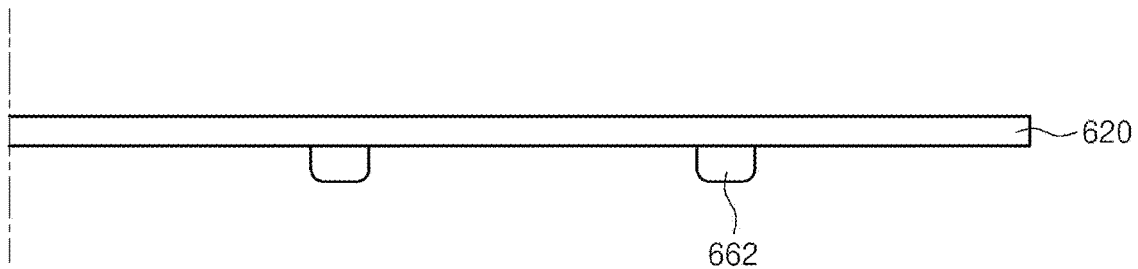
FIG. 11 is a front view of the ring carrier of FIG. 9.

FIG. 9 is a perspective view schematically illustrating an embodiment of a ring carrier used to transfer a ring member. FIG. 10 is a plan view of a bottom surface of the ring carrier of FIG. 9. FIG. 11 is a front view of the ring carrier of FIG. 9. Referring to FIG. 9 to FIG. 11, the ring carrier 60 in accordance with an embodiment of the inventive concept may include a plate 620, a guide part 640, and a leg 660.

A ring member R may be placed on a top surface of the plate 620. The plate 620 may have a plate shape. The plate 620 may have a circular plate shape. For example, the plate 620 has a diameter larger than a diameter of the ring member R. Since the plate 620 is provided in a circular plate shape, the ring member R may be stably supported on the plate 620 and transferred. A central region of the plate 620 may be provided as a blocking plate in which no hole is formed. Alternatively, a through hole for reducing a weight of the plate 620 may be formed at a central region of the plate 620.

A plurality of notches 621 may be formed in an edge region of the plate 620. A plurality of notches 621 may be provided in the edge area of the plate 620. A notch 621 is formed by penetrating from a top surface to a bottom surface of the plate 620. The notch 621 may be formed at the edge region of the plate 620 and may be formed in the edge region including an outer circumference of the plate 620. That is, the notch 621 may extend from the edge region of the plate 620 to the outer circumference of the plate 620. The notches 621 may be formed at positions aligned with support shelves 440 provided to the load lock chamber 40 when viewed from above. In addition, the notches 621 may be formed at positions overlapping the support slots F22 provided to the second container F2 when viewed from above. This prevents the ring carrier 60 from interfering with the support shelf 440 or/and the support slots F22 when the ring member R is transferred using the ring carrier 60.

When the ring member R is seated on the ring carrier 60 and the ring carrier 60 is transferred by a first transfer hand 242, the ring member R may slide by a straight movement of the first transfer hand 242 or a position seated by the rotation movement of the first transfer hand 242. The guide part 640 may prevent such a sliding or a distortion of a position of the ring member R.

The guide part 640 may protrude from the top surface of the plate 620. The guide part 640 may upwardly protrude from the top surface of the plate 620. An inner circumference of the ring member R placed on the ring carrier 60 may have a flat zone (FZ) and a round zone (RZ). The guide part 640 may be formed at a position facing an inner circumference of the flat-zone FZ of the ring member R. The guide part 640 may have a shape corresponding to the inner circumference of the ring member R. The guide part 640 may have a shape corresponding to the inner circumference of the ring member R including the flat-zone FZ.

The leg 660 may be supported in contact with a top surface of the first transfer hand 242. The leg 660 may protrude from the bottom surface of the plate 620. The leg 660 may downwardly protrude from the bottom surface of the plate 620. The leg 660 may be provided as the pad 662. The pad 662 may be made of a material having a stronger frictional force than the top surface of the first transfer hand 242. In an embodiment, the pad 662 may be made of a material such as a carbon-filled poly-ether-ether-ketone (PEEK). However, this is only an embodiment, and may be variously modified and provided to other known materials having similar properties. The pad 662 may be provided in a cylindrical shape. However, the shape of the pad 662 is not limited thereto, and may be modified into various shapes. At least one pad 662 may be provided. A plurality of pads 662 may be provided. In an embodiment, three pads 662 may be provided on the bottom surface of the plate 620.

Figure 12:
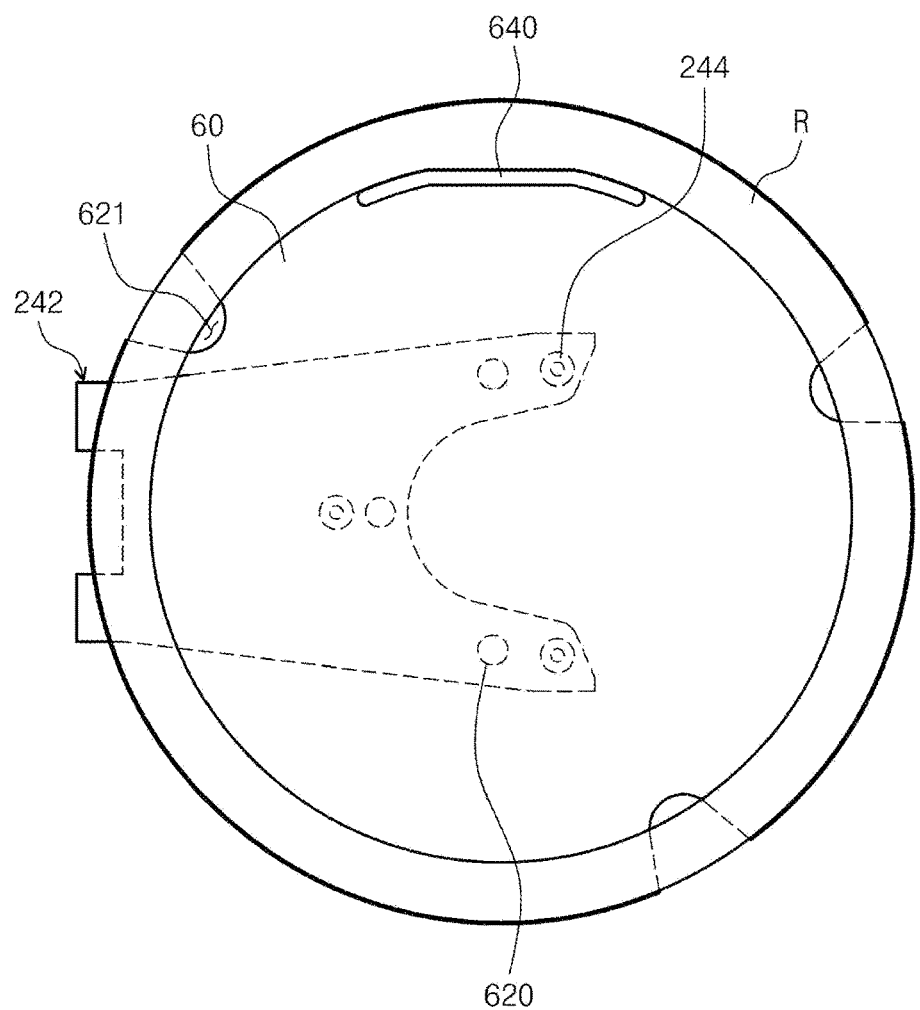
FIG. 12 schematically illustrates a state in which the ring member and the ring carrier are disposed at the first transfer hand of FIG. 2.
Figure 13:
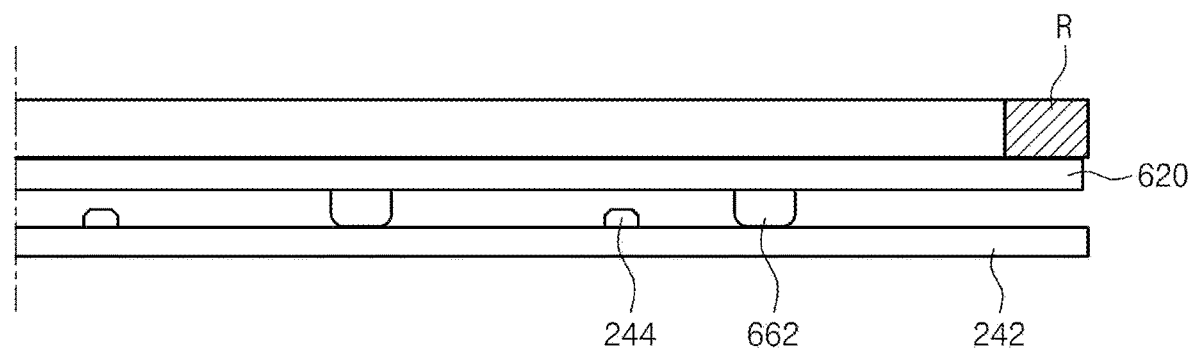
FIG. 13 illustrates a partially enlarged view of a state in which the ring member and the ring carrier are disposed on the first transfer hand of FIG. 12.

Hereinafter, a position where a pad 662 is provided and a specific form of the pad 662 will be described in relation to a first transfer hand 242. FIG. 12 schematically illustrates a state in which a ring member and a ring carrier are disposed on the first transfer hand of FIG. 2. FIG. 13 illustrates a partially enlarged view of a state in which the ring member and the ring carrier are disposed on the first transfer hand of FIG. 12.

Referring to FIG. 12, when viewed from above, the pad 662 are provided at a position that does not overlap the substrate support pad 244 of the first transfer hand 242 in a state in which the ring carrier 60 is supported at the first transfer hand 242. According to an embodiment, the pad 662 may be located in an inner region of the substrate support pads 244.

Referring to FIG. 13, when the ring carrier 60 is placed on the first transfer hand 242, the plate 620 may be spaced apart from the substrate support pad 244. The pad 662 may be provided at a height at which the plate 620 is upwardly spaced apart from the substrate support pad 244 when the ring carrier 60 is placed on the first transfer hand 242. When the ring carrier 60 is placed on the first transfer hand 242, the pad 662 may be provided at a height at which the bottom surface of the plate 620 and the top end of the substrate support pad 244 are spaced apart from each other. That is, when the ring carrier 60 is placed on the first transfer hand 242, the substrate support pad 244 may be provided at a height that does not contact the bottom surface of the plate 620. Accordingly, when the ring carrier 60 is transferred, a contamination of the substrate support pad 244 by the ring carrier 60 may be minimized. Accordingly, when the first transfer robot 240 carries the substrate W, it is possible to minimize a contamination of the substrate W due to the substrate support pad 244.

By providing the pad 662 to the plate 620, it is possible to prevent a slipping or a distortion of the ring carrier 60 used to transfer the ring member R when the first transfer robot 240 transfers the ring member R. By providing the pad 662 to the plate 620, it is possible to prevent the slipping or the distortion of the ring carrier 60 when the first transfer robot 240 transfers the ring carrier 60. Accordingly, the ring member R and/or the ring carrier 60 may be stably transferred. By providing the pad 662 to the plate 620, the ring member R and/or the ring carrier 60 may be stably transferred without a structural change of the first transfer robot 240.

Figure 14:
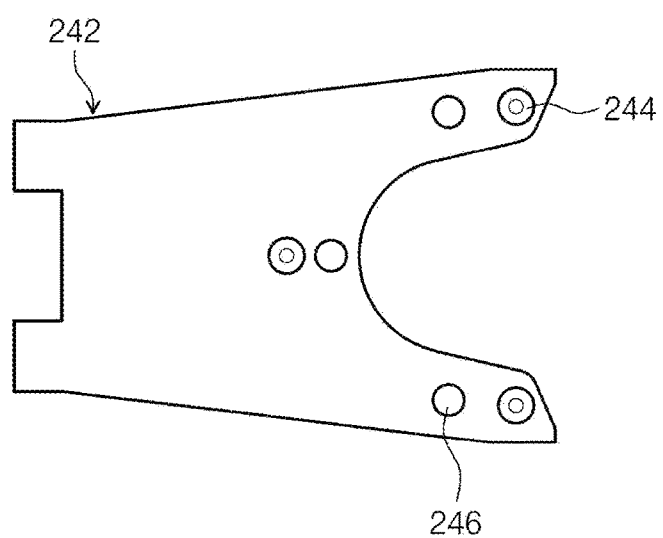
FIG. 14 schematically illustrates another embodiment of the first transfer hand of FIG. 1.
Figure 15:
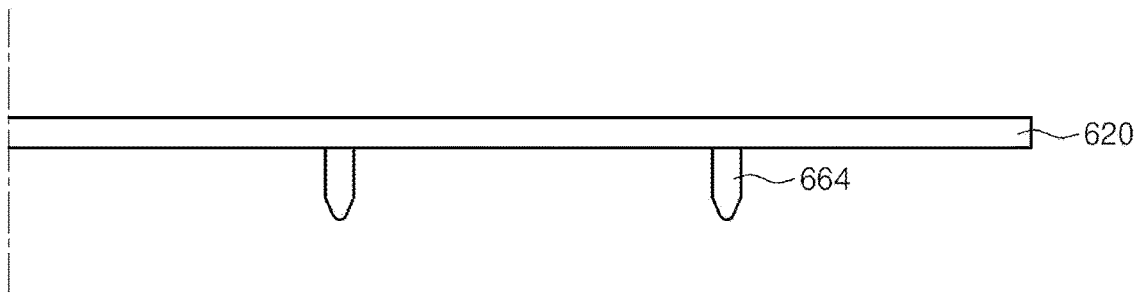
FIG. 15 is a front view of another embodiment of the ring carrier used to carry the ring member.
Figure 16:
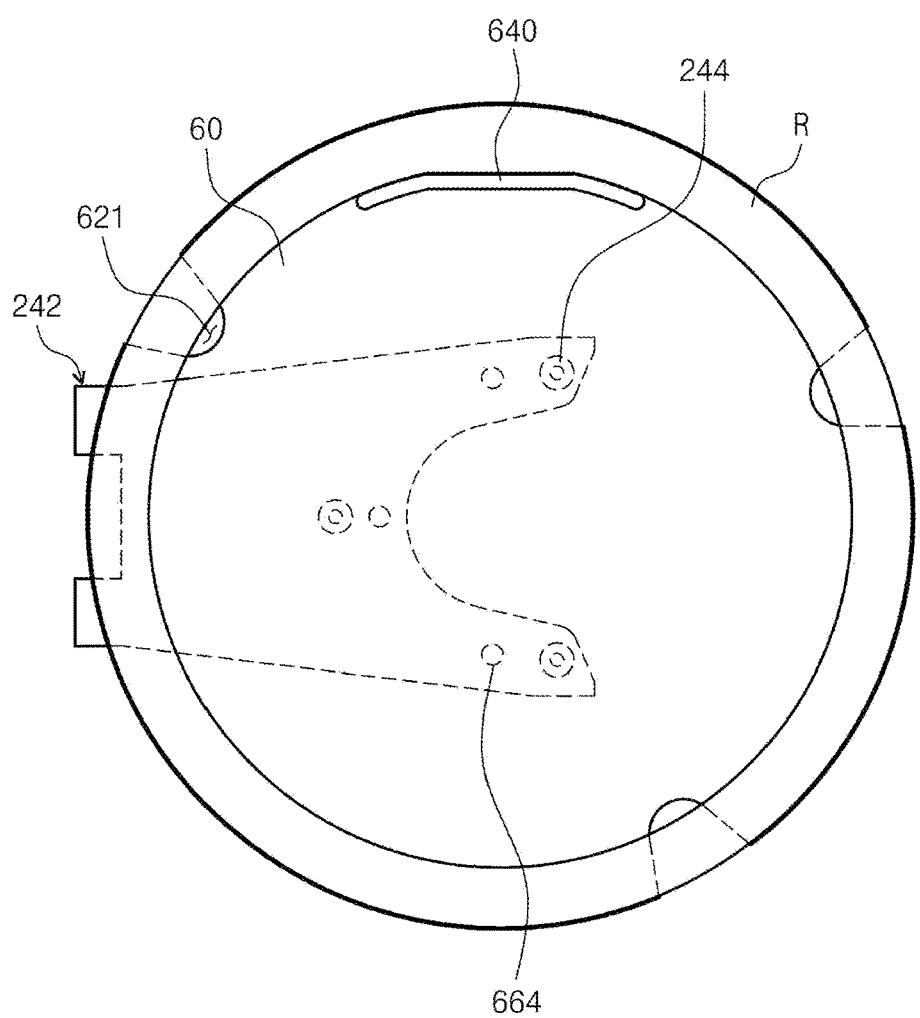
FIG. 16 schematically illustrates a state in which the ring member and the ring carrier are placed on the first transfer hand of FIG. 14.
Figure 17:
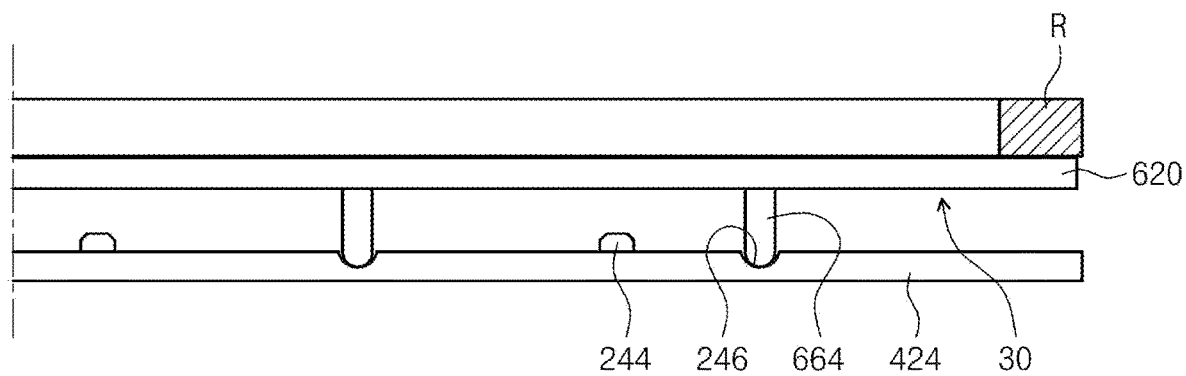
FIG. 17 is a view showing a partially enlarged view of a state in which the ring member and the ring carrier are placed on the first transfer hand of FIG. 14.

In the above-described example, a case where the leg 660 is provided as the pad 662 has been described as an example, but the inventive concept is not limited thereto. FIG. 14 schematically illustrates another embodiment of the first transfer hand of FIG. 1. FIG. 15 is a front view of another embodiment of a ring carrier used to carry a ring member. FIG. 16 schematically illustrates a state in which the ring member and the ring carrier are placed on the first transfer hand of FIG. 14. FIG. 17 shows a partially enlarged view of a state in which the ring member and the ring carrier are placed on the first transfer hand of FIG. 16.

Referring to FIG. 14, at least one substrate support pad 244 may be provided on a top surface of the first transfer hand 242. For example, three substrate support pads 244 may be provided to support three points of a transfer object placed on the first transfer hand 242. The object to be transferred may be a substrate W. The substrate support pad 244 may prevent the substrate W placed on the first transfer hand 242 from slipping. The substrate support pads 244 may be arranged along a circumferential direction of a virtual circle having a radius when viewed from above. The substrate support pad 244 may be provided in a substantially cylindrical shape.

At least one hole 246 may be formed on a top surface of the first transfer hand 242. A pin 644 to be described later may be inserted into a hole 246. The hole 246 may be provided in a form corresponding to a form of the pin 644. The hole 246 may be formed to have a height that does not penetrate the first transfer hand 242. The height of the hole 246 may be provided to be lower than a thickness of the first transfer hand 242.

A ring carrier 60 according to another embodiment of the inventive concept may include a plate 620, a guide part 640, and a leg 660. The ring carrier 60 described in the inventive concept is provided substantially similar to the ring carrier 60 described in FIG. 9 to FIG. 13. Hereinafter, a description overlapping the ring carrier 60 described with reference to FIG. 9 to FIG. 13 will be omitted.

Referring to FIG. 15 to FIG. 17, the leg 660 may be supported in contact with a top surface of the first transfer hand 242. The leg 660 may protrude from a bottom surface of the plate 620. The leg 660 may downwardly protrude from the bottom surface of the plate 620. The leg 660 may be provided as a pin 664. In an embodiment, the pin 664 may be provided in a cylindrical shape. In another embodiment, the pin 664 may be provided in a cylindrical shape, and a bottom surface thereof may be provided in a convex shape in a downward direction. However, a form of the pin 664 is not limited thereto, and may be deformed into various shapes. At least one pin 664 may be provided. A plurality of pins 664 may be provided. In an embodiment, three pins 664 may be provided on the bottom surface of the plate 620. The pins 664 may be provided in a number corresponding to the holes 246 provided on the top surface of the first transfer hand 242. The pin 664 may be provided at a position overlapping the hole 246 when the first transfer hand 242 supports the ring carrier 60.

The pin 664 is inserted into the hole 246 provided on the top surface of the first transfer hand 242. Accordingly, the ring carrier 60 may be supported on the first transfer hand 242. When the ring carrier 60 is supported on the first transfer hand 242, the pin 664 is provided at a position that does not overlap the substrate support pad 244 of the first transfer hand 242 when viewed from above.

When the ring carrier 60 is placed on the first transfer hand 242, the plate 620 may be spaced apart from the substrate support pad 244. The pin 664 may be provided at a height at which the plate 620 is upwardly spaced apart from the substrate support pad 244 when the ring carrier 60 is placed on the first transfer hand 242. When the ring carrier 60 is placed on the first transfer hand 242, the pin 664 may be provided at a height at which the bottom surface of the plate 620 and the top end of the substrate support pad 244 are spaced apart from each other. That is, when the ring carrier 60 is placed on the first transfer hand 242, the substrate support pad 244 may be provided at a height that does not contact the bottom surface of the plate 620. Accordingly, when the ring carrier 60 is transferred, a contamination of the substrate support pad 244 by the ring carrier 60 may be minimized. Accordingly, when the first transfer robot 240 carries the substrate W, it is possible to minimize a contamination of the substrate W due to the substrate support pad 244.

By providing a pin 664 to the plate 620, the first transfer robot 240 and the ring carrier 60 are inserted and fixed via the pin 664. Accordingly, when the first transfer robot 240 transfers the ring member R, a slipping or/and a distortion of the ring carrier 60 used to transfer the ring member R may be prevented. By providing the pin 664 to the plate 620, it is possible to prevent the slipping and/or the distortion of the ring carrier 60 when the first transfer robot 240 transfers the ring carrier 60. Accordingly, the ring member R and/or the ring carrier 60 may be stably transferred. By providing the pin 664 to the plate 620, the ring member R and/or the ring carrier 60 may be stably transferred without a structural change of the first transfer robot 240.

In the above description, a case in which the ring carrier 60 is transported by the first transfer robot 240 is described as an example, but the inventive concept is not limited thereto, and the second transfer robot 340 may also transfer the ring member R using the ring carrier 60. Even when the ring member R is transferred by the second transfer robot 340 using the ring carrier 60, it is provided similarly to the case where the ring carrier 60 is transferred by the first transfer robot 240, and thus a detailed description thereof will be omitted.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   an atmospheric pressure transfer module provided with a first transfer robot having a first hand with a substrate placed thereon;
   a vacuum transfer module provided with a second transfer robot having a second hand with a substrate placed thereon;
   a load-lock chamber positioned between the atmospheric pressure transfer module and the vacuum transfer module, and having an inner space convertible between an atmospheric pressure atmosphere and a vacuum atmosphere;
   a process chamber coupled to the vacuum transfer module and treating the substrate; and
   a ring carrier which can be supported by the first transfer robot or the second transfer robot for a transfer of a ring member provided at the process chamber and supporting the ring member, and
   wherein the ring carrier comprises:
   a plate having the ring member placed thereon; and
   at least one leg protruding from a bottom surface of the plate and placed at the first hand or the second hand,
   wherein the load-lock chamber includes a plurality of support shelves supporting the substrate or the ring member in the inner space,
   wherein a plurality of notches are formed through the plate at an edge region of the plate, and
   the ring member supported by the ring carrier is seated on a support shelf when the first transfer robot or the second transfer robot is moved from a top side to a bottom side of the plurality of support shelves, and the plurality of notches are positioned to be aligned with the plurality of support shelves so the ring carrier moves together with the first transfer robot and the second transfer robot.

2. The substrate treating apparatus of claim 1, wherein the leg is provided as a pad.

3. The substrate treating apparatus of claim 2, wherein at least one substrate support pad for supporting a substrate is provided at a top surface of the first hand or the second hand, and
   wherein the pad is provided at a height at which the plate is upwardly spaced apart from the substrate support pad, when the ring carrier is placed on the first hand or the second hand.

4. The substrate treating apparatus of claim 3, wherein the pad and the substrate support pad are positioned to not interfere with each other seen from above when the first transfer robot or the second transfer robot transfers the ring member.

5. The substrate treating apparatus of claim 4, wherein the pad is a cylindrical shape.

6. The substrate treating apparatus of claim 1, wherein the leg is provided as a pin, and at least one substrate support pad for supporting a substrate is provided at a top surface of the first hand or the second hand, and a hole for inserting an end of the pin is further included.

7. The substrate treating apparatus of claim 6, wherein the pin is positioned at a height at which the plate is upwardly spaced apart from the substrate support pad, when the ring carrier is placed on the first hand or the second hand.

8. The substrate treating apparatus of claim 7, wherein the pin and the substrate support pad are positioned to not interfere with each other when seen from above when the first transfer robot or the second transfer robot transfers the ring member.

9. The substrate treating apparatus of claim 8, wherein the pin is provided in a cylindrical shape with a downwardly convex bottom surface.

10. The substrate treating apparatus of claim 1, wherein the plate is a circular plate form.

11. A transfer assembly comprising:
    a ring carrier supporting a ring member; and
    a transfer robot having a transfer hand for selectively transferring a substrate and the ring carrier, and
    wherein the ring carrier comprises:
    a plate on which the ring member is placed; and
    at least one leg protruding from a bottom surface of the plate, and placed on the transfer hand,
    wherein the leg is provided as a pin, and at least one substrate support pad for supporting the substrate is provided at a top surface of the transfer hand, and a hole for inserting an end of the pin is further included, and wherein the pin is provided at a height at which the plate is upwardly spaced apart from the substrate support pad, when the ring carrier is placed on the transfer hand, and the pin and the substrate support pad are positioned to not interfere with each other when seen from above when the transfer robot transfers the ring member.

12. The transfer assembly of claim 11, wherein the plate is a circular plate form.

13. A substrate treating apparatus comprising:
a load port on which a container storing a substrate, a ring carrier, or a ring member is placed thereon;
an index chamber having an inside maintained at an atmospheric pressure atmosphere, and providing a transfer robot;
a load-lock chamber having an inside convertible between an atmospheric pressure and a vacuum pressure; and
a ring carrier used during a transfer of a ring member between the load port, the load-lock chamber, and the index chamber, and
wherein the transfer robot comprises:
a transfer hand selectively transferring a substrate and the ring carrier; and
at least one substrate support pad for supporting the substrate, and wherein the load-lock chamber comprises a plurality of support shelves supporting the substrate or the ring member, and wherein the ring carrier comprises:
a plate on which the ring member is placed; and
at least one leg protruding from a bottom surface of the plate, and placed on the transfer hand, and
wherein a plurality of notches are formed through the plate at an edge region of the plate, and the plurality of notches are positioned to overlap each of the plurality of support shelves when seen from above, and
wherein among the ring carrier and the ring member, the ring member is seated on a support shelf when the transfer robot transfers the ring member using the ring carrier, and
wherein the leg is positioned at a height at which the plate is upwardly spaced apart from the substrate support pad, when the ring carrier is placed on the transfer hand, and
wherein the leg and the substrate support pad are positioned to not interfere with each other when seen from above when the transfer robot transfers the ring member.

14. The substrate treating apparatus of claim 13, wherein the leg is provided as a pad.

15. The substrate treating apparatus of claim 13, wherein the leg is provided as a pin, and a hole for inserting an end of the pin is further included at a top surface of the transfer robot.

* * * * *